(12) United States Patent
Colli (10) Patent No.: US 8,022,393 B2
(45) Date of Patent: Sep. 20, 2011

(54) LITHOGRAPHIC PROCESS USING A NANOWIRE MASK, AND NANOSCALE DEVICES FABRICATED USING THE PROCESS

(75) Inventor: Alan Colli, Cambridge (GB)

(73) Assignee: Nokia Corporation, Espoo (FI)

( * ) Notice: Subject to any disclaimer, the term of this patent is extended or adjusted under 35 U.S.C. 154(b) by 390 days.

(21) Appl. No.: 12/221,068

(22) Filed: Jul. 29, 2008

(65) Prior Publication Data
US 2010/0025658 A1   Feb. 4, 2010

(51) Int. Cl.
*H01L 29/06* (2006.01)
(52) U.S. Cl. ......... 257/24; 257/9; 257/14; 257/E21.404; 257/E21.408; 257/E29.07; 257/E29.245; 257/E51.04; 438/300
(58) Field of Classification Search ................ 257/9, 14, 257/24, 288, E21.404, E21.408, E29.07, 257/E29.245, E51.04; 438/300
See application file for complete search history.

(56) References Cited

U.S. PATENT DOCUMENTS

| | | | | |
|---|---|---|---|---|
| 2005/0121706 A1* | 6/2005 | Chen et al. | | 257/288 |
| 2006/0105523 A1 | 5/2006 | Afzali-Ardakani et al. | | |
| 2007/0126044 A1* | 6/2007 | Shioya et al. | | 257/306 |
| 2007/0238291 A1 | 10/2007 | Snider et al. | | |

FOREIGN PATENT DOCUMENTS

| | | |
|---|---|---|
| WO | 03/083928 | 10/2003 |
| WO | 2004/032191 | 4/2004 |
| WO | 2009/011975 | 1/2009 |

OTHER PUBLICATIONS

Whang et al., "Nanolithography using hierarchically assembled nanowire masks," Nano Letters, vol. 3, No. 7, Apr. 2003, pp. 951-954.
S. Myung et al., "'Focused' assembly of $V_2O_5$ nanowire masks for the fabrication of metallic nanowire sensors," Nanotechnology 18, 2007, 4 pp.
M. G. Ancona et al., "Patterning of narrow Au nanocluster lines using $V_2O_5$ nanowire masks and ion-beam milling," Nano Letters, vol. 3, No. 2, 2003, pp. 135-138.
R. Šordan et al., "Removable template route to metallic nanowires and nanogaps," Applied Physics Letters, vol. 79, No. 13, Sep. 24, 2001, pp. 2073-2075.
W. Yun et al., "Fabrication of metal nanowire using carbon nanotube as a mask," J. Vac. Sci. Technol. A 18(4), Jul./Aug. 2000, pp. 1329-1332.
F. Qian et al., "Core/multishell nanowire heterostructures as multicolor, high-efficiency light-emitting diodes," Nano Letters, vol. 5, No. 11, Sep. 2005, pp. 2287-2291.

(Continued)

*Primary Examiner* — Benjamin P Sandvik
*Assistant Examiner* — Farid Khan (57) ABSTRACT

The disclosure pertains to a method for making a nanoscale filed effect transistor structure on a semiconductor substrate. The method comprises disposing a mask on a semiconductor upper layer of a multi-layer substrate, and removing areas of the upper layer not covered by the mask in a nanowire lithography process. The mask includes two conductive terminals separated by a distance, and a nanowire in contact with the conductive terminals across the distance. The nanowire lithography may be carried out using a deep-reactive-ion-etching, which results in an integration of the nanowire mask and the underlying semiconductor layer to form a nanoscale semiconductor channel for the field effect transistor.

22 Claims, 5 Drawing Sheets

OTHER PUBLICATIONS

Y. Dong et al., "Si/a-Si core/shell nanowires as nonvolatile crossbar swtiches," Nano Letters, vol. 8, No. 2, Jan. 2008, pp. 386-391.

F. Qian et al., "Gallium nitride-based nanowire radial heterostructures for nanophotonics," Nano Letters, vol. 4, No. 10, Aug. 2004, pp. 1975-1979.

R. Fan et al., "Fabrication of silica nanotube arrays from vertical silicon nanowire templates," J. Am. Chem. Soc. 2003, vol. 125, No. 18, pp. 5254-5255.

L. J. Lauhon et al., "Epitaxial core-shell and core-multishell nanowire heterostructures," Letters to Nature, vol. 420, Nov. 7, 2002, pp. 57-61.

S. Kawasaki et al., "Conformal oxide coating of carbon nanotubes," Applied Physics Letters 92, Feb. 8, 2008, 3 pp.

Y. Li et al., "Indium-assisted growth of aligned ultra-long silica nanotubes," Advanced Materials, vol. 16, No. 1, Jan. 5, 2004, pp. 37-40.

X. Duan et al., "Nonvolatile memory and programmable logic from molecule-gated nanowires," Nano Letters, vol. 2, No. 5, Mar. 2002, pp. 487-490.

C. R. Barrett, "The digital evolution," MRS Bulletin, vol. 31, Nov. 2006, pp. 906-913.

A. Bachtold et al., "Logic circuits with carbon nanotube transistors," Science Magazine, vol. 294, Nov. 9, 2001, pp. 1317-1320.

V. Derycke et al., "Carbon nanotube inter- and intramolecular logic gates," Nano Letters, vol. 1, No. 9, Sep. 2001, pp. 453-456.

Y. Huang et al., "Logic gates and computation from assembled nanowire building blocks," Science Magazine, vol. 294, Nov. 9, 2001, pp. 1313-1317.

Y. Cui et al., "Functional nanoscale electronic devices assembled using silicon nanowire building blocks," Science Magazine, vol. 291, Feb. 2, 2001, pp. 851-853.

S. J. Tans et al., "Room-temperature transistor based on a single carbon nanotube," Letters to Nature, vol. 393, May 7, 1998, pp. 49-52.

R. Martel et al., "Single- and multi-wall carbon nanotube field-effect transistors," Applied Physics Letters, vol. 73, No. 17, Oct. 26, 1998, pp. 2447-2449.

C. Zhou et al., "Electrical measurements of individual semiconducting single-walled carbon nanotubes of various diameters," Applied Physics Letters, vol. 76, No. 12, Mar. 20, 2000, pp. 1597-1599.

X. Duan et al., "Indium phosphide nanowires as building blocks for nanoscale electronic and optoelectronic devices," Letters to Nature, vol. 409, Jan. 4, 2001, pp. 66-69.

Y. Huang et al., "Gallium nitride nanowire nanodevices," Nano Letters, vol. 2, No. 2, 2002, pp. 101-104.

A. Colli et al., "Nanowire lithography on silicon," Nano Letters, vol. 8, No. 5, Feb. 2008, pp. 1358-1362.

A. Colli et al., "Thermal and chemical vapor deposition of Si nanowires: shape control, dispersion, and electrical properties," Journal of Applied Physics 102, 2007, 13 pp.

M. Cumbie, "Misalignment-tolerant H-hot demultiplexer for nanowire arrays," International Newsletter on Micro-Nano Integration, MST News, No. 4/06, Aug. 2006, pp. 8-10.

Notification of Transmittal of the International Search Report and the Written Opinion of the International Searching Authority (3 pages), International Search Report (7 pages) and Written Opinion of the International Searching Authority (10 pages), 20 pages total.

"Nanowire Lithography on Silicon" by Alan Colli et al; Nano Letters 2008, vol. 8, No. 5, published on Web Apr. 4, 2008, pp. 1358-1362.

* cited by examiner

LITHOGRAPHIC PROCESS USING A NANOWIRE MASK, AND NANOSCALE DEVICES FABRICATED USING THE PROCESS

TECHNICAL FIELD

This disclosure relates to fabrication of nono-scale electronic devices. In particular, this disclosure relates to using a nanowire mask in a lithographic process for fabricating field effect transistor-like structures on a semiconductor substrate.

BACKGROUND ART

Device scaling in microelectronics is confined by fundamental physical limits and/or economic constraints. New device concepts and fabrication approaches that may result in integration levels far beyond the limits of conventional microelectronics are constantly being explored. However, the ultimate goal of the exploration is not to simply make the existing electronic components smaller than they are today, but rather to exploit unique properties of the device materials at a nanometer scale to integrate different functions within a single block, to perform conventional functions with less power consumption, or to develop inexpensive fabrication methods driven by self-assembly.

One of the emerging approaches that may overcome the existing limitations is the so-called bottom-up assembly of well-defined nanoscale building blocks (hereinafter, the prefix "nano" refers to a lateral dimension scale of about one tenth of a nanometer to one hundred nanometers). Examples of the nanoscale building blocks include molecule clusters, quantum dots, and nanowires. Properties of these nanoscale building blocks that can be controlled include size, morphology, chemical composition, etc.

In particular, nanowires and carbon nanotubes (CNTs) have been used to construct various functional devices and device arrays, including field effect transistors (FETs), p-n diodes, bipolar junction transistors and integrated logic circuits. These results represent important advances for the nanoelectronics, yet the development of the nanoscale device structures that exhibit new device functions may open up additional and potentially unexpected opportunities for nanoelectronic systems.

Figure 1:
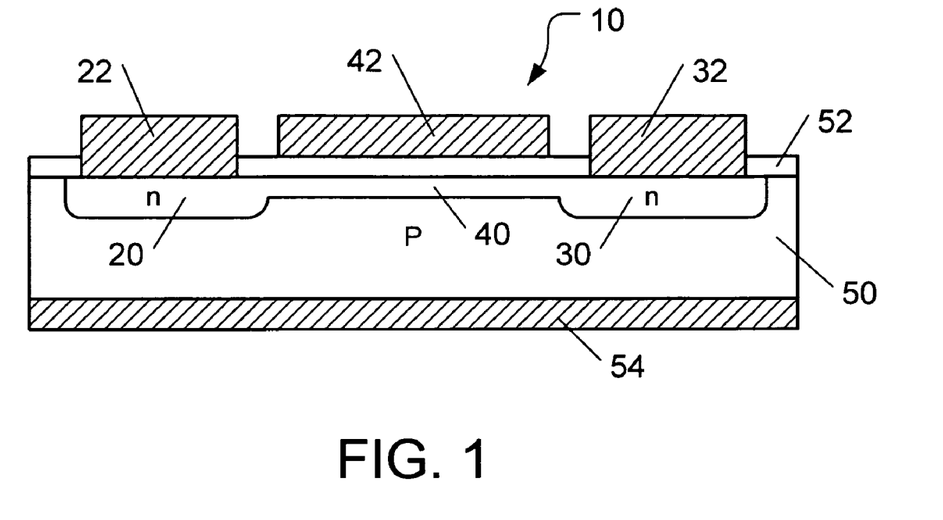
FIG. 1 is a schematic cross-sectional view of a conventional MOSFET structure fabricated by a conventional top-down lithographic process.

As shown in FIG. 1, the elemental building block that lies at the bottom of the fabrication stack in the current semiconductor technology is the metal-oxide-semiconductor field-effect transistor (MOSFET) 10. This device is fabricated via a so-called top-down fabrication method that builds the device structure (including highly doped source region 20 and drain region 30) into an opposite doped semiconductor substrate 50. A source terminal 22 and a drain terminal 32 are deposited on the source region 20 and drain region 30, respectively. A dielectric oxide layer 52 is deposited on the substrate 50 and a gate terminal 42 is deposited on the dielectric layer 52. A back contact layer 54 is deposited on the surface of the substrate opposing the doped source and drain regions.

The MOSFET works by modulating charge concentration using a gate voltage between a body electrode (back contact 54) and the gate terminal 42. With a sufficient gate voltage, electrons from the source enter the area between the source 20 and the drain 30 to form an inversion layer or channel 40 at the interface between the substrate 50 and the dielectric layer 52. This conducting channel 40 extends between the source and the drain, and current is conducted through it when a voltage is applied between the source and the drain.

Currently, the dimensions of the conventional MOSFETs have been scaled down to a few tens of nanometers. Gate lengths as short as 30-40 nm are being routinely produced for modern microprocessors.

Figure 2:
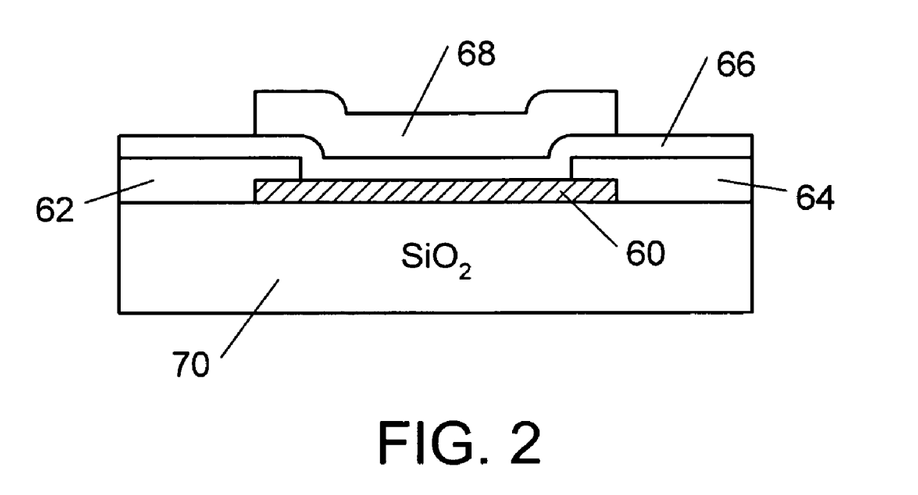
FIG. 2 is a schematic cross-sectional view of a lithographically defined, top-gated nanowire FET.
Figure 3:
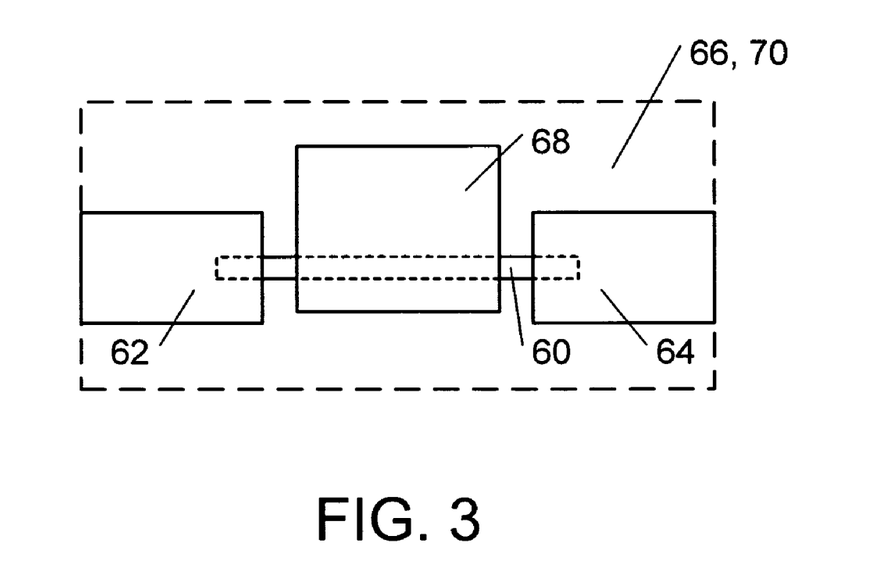
FIG. 3 is a schematic top view of the top-gated nanowire FET.

Instead of the conventional top-down approach used for many years in microelectronic device fabrication, some semiconductor devices can now be fabricated by a so-called bottom-up process. The bottom-up approach employs a well controlled self-assembly process of atoms to form a nanoscale device structure on a semiconductor substrate. This approach is considered a more precise technique of engineering such devices at the nanometer level. Most of the prior work on the bottom-up FET fabrication concentrates on prototypes based on individual CNTs and nanowires that form a nanostructure. Essentially, the chemically synthesized nanostructure plays the role of a freestanding transistor channel, while source, drain, and gate terminals are later fabricated with top-down nanolithography. A typical example of a transistor structure fabricated by the bottom-up process is shown in FIGS. 2 and 3. A semiconductor nanowire 60 is disposed on a $SiO_2$ substrate 70. Two metal contacts 62 and 64 are deposited on the substrate, connecting via the semiconductor nanowire 60. An insulator layer 66 is deposited on the nanowire 60 and the metal contacts 62 and 64. A third metal contact 68 is deposited on the insulator layer 66 above the nanowire region. The nanowire 60 forms a channel between the two metal contacts 62 and 64 that act as a source terminal and a drain terminal, respectively, and the third metal contact 68 acts as a gate terminal (back contact omitted for simplicity).

However, the above-described example of the bottom-up approach still has a size limitation that is determined by the gate width. As the channel length scales down, it becomes very difficult to precisely align the top gate on the nanowire channel. Therefore, the same challenges and limitations faced by top-down methods still exist in this approach.

In this disclosure, a refined bottom-up fabrication process is revealed. This process is based on easy, inexpensive and large-area fabrication methods for the fabrication of integrated nanodevices.

SUMMARY OF THE INVENTION

In a first aspect of the invention, a method is provided. The method comprises disposing a mask on a semiconductor upper layer of a multi-layer substrate, the semiconductor upper layer being adjacent to an insulator lower layer, and removing areas of the upper layer not covered by the mask in a first lithography. The mask comprises a first and a second conductive pads separated by a distance, and a nanowire in contact with the first and the second conductive pads across the distance.

In the method above, the first lithography may be carried out using a deep-reactive-ion-etching, which results in an integration of the mask and the underlying semiconductor upper layer.

In the method above, the nanowire may have a length of 0.1 to 50 microns and a diameter of 10 to 50 nanometers. The upper layer may comprise silicon, the lower layer may comprise silicon dioxide, and the nanowire may comprise silicon dioxide. The upper layer may be doped with a positive carrier element or a negative carrier element.

The above method may further comprise disposing an insulating layer covering the nanowire and the silicon layer, and disposing a third conductive pad on the insulating layer. The first and the second conductive pads form a source terminal and a drain terminal, respectively, and the third conductive pad forms a gate terminal, of a field effect transistor.

In the method, the nanowire may comprise a shell made of an insulating material and a core made of a conductive or a semiconductive material. The nanowire is in contact with the first and the second conductive pads across the distance and extends beyond one of the conductive pads as an extended section. The method may further comprise removing an area of the upper layer covered by the extended section of the nanowire in a second lithography, removing a part of the shell at the extended section to expose the conductive or semiconductive core, and disposing a third conductive pad in contact with the exposed core. The first and the second conductive pads form a source terminal and a drain terminal, respectively, and the third conductive pad forms a gate terminal, of a field effect transistor.

In the method above, the shell of the nanowire may be at least 5 nanometers in thickness. The core of the nanowire may be Al, Si or Ti and the shell of the nanowire may be an oxide of Al, Si or Ti, respectively. Or, the core of the nanowire may be Si and the shell of the nanowire may be silicon dioxide. Or, the core of the nanowire may be a carbon nanotube and the shell of the nanowire may be silicon dioxide.

In the method above, the first and the second conductive pads form a first pair of terminals. The mask may further comprise one or more pairs of terminals, and the nanowire may be in contact with the one or more pairs of terminals and may extend beyond all the terminals as the extended section. Each pair of terminals and the third conductive pad may form a field effect transistor.

In a second aspect of the invention, a device is provided. The device comprises a first and a second conductive terminals separated by a distance, and a channel connecting the first and the second terminals across the distance. The device is constructed by disposing a mask comprising the first and the second conductive terminals and a nanowire across the distance in touch with the conductive terminals on a semiconductor upper layer of a multi-layer substrate, the semiconductor upper layer being adjacent to an insulator lower layer, and removing areas of the upper layer not covered by the mask in a first lithography to form the channel.

In the device above, the first lithography may be carried out using a deep-reactive-ion-etching, which may result in an integration of the mask and the underlying semiconductor upper layer.

In the device, the nanowire may have a length of 0.1 to 50 microns and a diameter of 10 to 50 nanometers. The upper layer may comprise silicon, the lower layer may comprise silicon dioxide, and the nanowire may comprise silicon dioxide. The upper layer may be doped with a positive carrier element or a negative carrier element.

The device may further comprise an insulating layer covering the nanowire and the silicon layer, and a third conductive terminal disposed on the insulating layer. The device may be a field effect transistor and the first and the second conductive terminal are a source terminal and a drain terminal, respectively, and the third conductive terminal is a gate terminal.

In the device above the nanowire may comprise a shell made of an insulating material and a core made of a conductive or a semiconductive material. The nanowire may be in contact with the first and the second conductive terminals across the distance and may extend beyond one of the conductive terminals as an extended section. The device may further comprise a third conductive terminal. The first and the second conductive terminals form a source terminal and a drain terminal, respectively, and the third conductive terminal forms a gate terminal, of a field effect transistor. The third terminal may be constructed by removing an area of the upper layer covered by the extended section of the nanowire in a second lithography, removing a part of the shell at the extended section to expose the conductive or semiconductive core, and disposing the third conductive terminal in contact with the exposed core.

In the device above, the shell of the nanowire may be at least 5 nanometers in thickness. The core of the nanowire may be Al, Si or Ti and the shell of the nanowire may be an oxide of Al, Si or Ti, respectively. Or, the core of the nanowire may be Si and the shell of the nanowire may be silicon dioxide. Or, the core of the nanowire may be a carbon nanotube and the shell of the nanowire may be silicon dioxide.

In the device above, the first and the second conductive terminals may form a first pair of terminals. The mask may further comprise one or more pairs of terminals. The nanowire may be in contact with the one or more pairs of terminals and may extend beyond all the terminals as the extended section. Each pair of terminals and the third conductive terminal may form a field effect transistor.

BRIEF DESCRIPTION OF THE DRAWINGS

The features and advantages of the invention will become apparent from a consideration of the subsequent detailed description presented in connection with accompanying drawings, in which.

DETAILED DESCRIPTION

The present disclosure pertains to a nanoscale FET device concept and a process for making the device. The FET is integrated into a fundamental block such as a silicon-on-insulator (SOI) substrate. Such architecture is achievable by a self-aligned, easy and inexpensive fabrication process, which is developed based on a nanowire lithography (NWL) method.

Figure 4A:
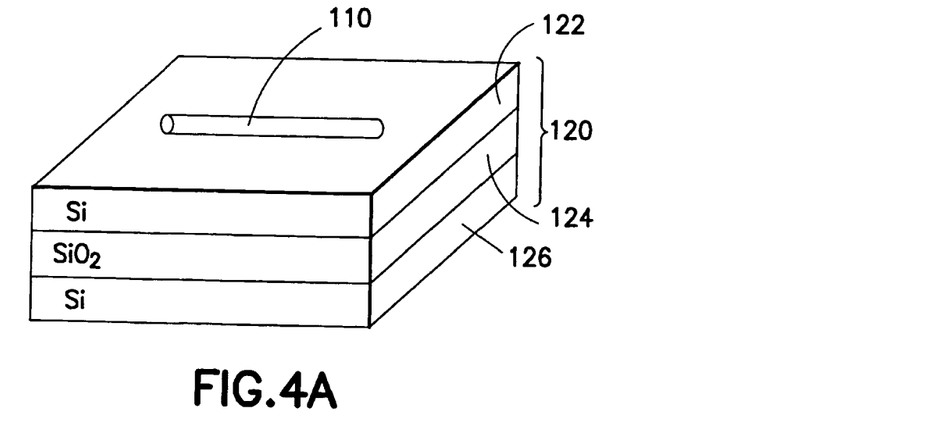
FIGS. 4A-4C illustrate a fabrication process for a direct-bridge single nanowire device that uses nanowire lithography (NWL) on a silicon on insulator (SOI) layered substrate according to an embodiment of the invention.
Figure 4B:
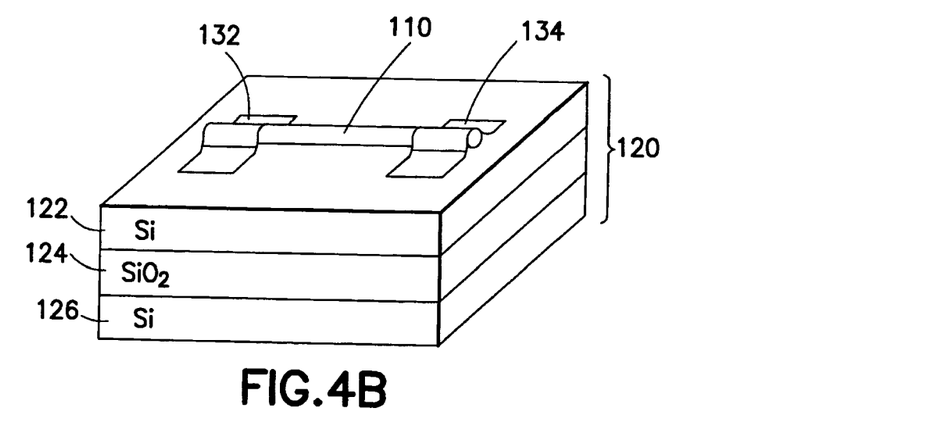
Figure 4C:
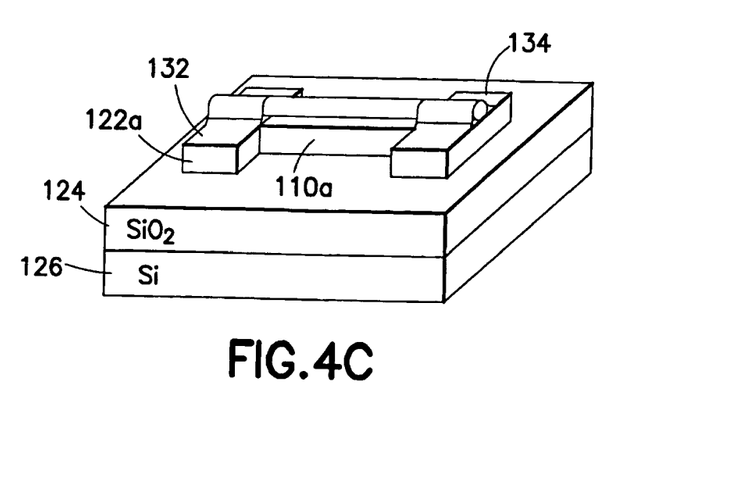

NWL uses a chemically synthesized nanowire or a nanotube as part of a mask for etching a conformal one-dimensional structure into an underlying thin film substrate. FIGS. 4A-4C show an exemplary NWL process using a silicon-based nanowire for making a nonodevice structure on a SOI substrate. Silicon-based nanowires can be obtained by various growth methods that are either known in the art or being developed. One example of obtaining the Si-based nanowires is by Au-seeded or oxide-assisted vapor-transport growth. In some of the methods, the silicon-based nanowires are originally synthesized as silicon single-crystalline, then fully converted to $SiO_2$ by furnace annealing in oxygen atmosphere. Preferably, the final $SiO_2$ nanowires suitable for use as a nanowire mask have a length of 100 nanometers to 10 microns and a diameter from 10 to 50 nanometers.

First, as shown in FIG. 4A, to fabricate a single-nanowire device, an oxidized silicon nanowire is dispersed on top of a SOI substrate 120. The SOI substrate 120 comprises at least a silicon upper layer 122, a $SiO_2$ lower layer 124 and maybe other layers 126. The SOI substrate suitable for the present invention may be prepared by techniques known in the art or being developed, and, as commonly known, the semiconductor active layer 122 may be properly doped with p-type or n-type charge carriers depending on the application of the device.

Next, as shown in FIG. 4B, the nanowire 110 is contacted by two separate metal contacts or pads 132 and 134, so that the nanowire 110 bridges a gap between the metal contacts 132 and 134. Metal contacts may be deposited on the SOI substrate by methods known in the art or being developed, for example, by way of electron beam or ultraviolet (UV) lithography. The resulting metal contacts and nanowire combination forms a mask on the SOI substrate 120. It is important to note that, as a major advantage of the NWL concept, the metal contacts can be deposited either before or after disposing the nanowire, as far as the quality of the contacts is concerned.

Next, as shown in FIG. 4C, the areas of the top silicon layer 122 of the SOI substrate 120 that are not covered by the mask are etched away, leaving a single-crystalline silicon structure 122a on the $SiO_2$ insulator layer 124. The suitable etching method for the process may be a so-called deep-reactive-ion-etching (DRIE) method. DRIE is a highly anisotropic etching process suitable for creating deep, steep-sided holes and trenches in substrates. It is effective in resulting an integration of the nanowire mask 110, 132, 134 with the underlying silicon active layer 122a.

The as-formed device structure comprises two metal contacts connected by a semiconductor channel 110a which is about the same width as the $SiO_2$ nanowire 110 and which is integrated with the nanowire 110. The two contact pads 132 and 134 will later play the function of a source terminal and a drain terminal, respectively, of an FET. During the above NWL steps, the $SiO_2$ nanowire 110 plays a crucial role. However, since the $SiO_2$ nanowire is not conductive, it is a passive element in the device operation. In terms of device functionality, the resulting silicon structure is equivalent to the Si nanowire FET shown in FIG. 2 (once a top-gate is deposited), i.e., it does not matter whether the nanowire channel is etched into the SOI substrate or made of a freestanding chemically synthesized nanowire disposed on a $SiO_2$ substrate.

The NWL process according to the present invention can be further extended. In one embodiment, the nanowire mask can be arranged to play active roles in the device operation. In the above-described particular example of the silicon-based device structure, the process according to the present invention uses a $SiO_2$ nanowire as a part of the mask because of the high Si-to-$SiO_2$ selectivity of the DRIE process (basically, Si is etched very efficiently while $SiO_2$ is almost unaffected). This means that a 30 nm thick $SiO_2$ nanowire retains very well its masking function even for the etching of the silicon layer to a depth of several microns. Consequently, for an etching depth of 100 nm or less, fully oxidized nanowire masks (e.g. 30 nm of $SiO_2$) are redundant for the NWL process to work properly. In fact, only a relatively thin (~5 nm) oxide outer layer (a shell) might be necessary as an efficient etching mask, thus leaving a protected nanowire core of a different material or with different properties available as an active element for the device operation.

Therefore, by using a double-layered core-shell nanowire as a mask, the bottom-up NWL method with the DRIE process can precisely align and integrate two isolated nanowires on top of each other for their whole length. In this combination, one nanowire is the nanowire mask that has an active core and a protective shell, and another nanowire is the etch-produced nanoscale active layer underneath the nanowire mask. This structure can be achieved without the difficult task of assembling or manipulating two nanowires on the nanoscale. Hereinafter, we refer to this structure as a twin-nanowire, emphasizing the similarity between the nanowire mask and the etch-produced nanowire in terms of morphology and active role, but not posing any constriction on their chemical composition, internal structure, or ultimate functionality within the final device architecture.

An exemplary NWL process for fabricating the above-described self-aligned twin-nanowire structure according to an embodiment of the present invention is shown in FIGS. 5A-5E. The self-aligned twin-nanowire structure produced by the NWL process is a basic building block for a twin-nanowire transistor (TWT). In its basic form, the TWT needs a nanowire mask that comprises a nanowire made of a conductive core and an insulating shell. This nanowire can be, for example, a $SiO_2$-coated multi-wall carbon nanotube, or a "metal core/metal-oxide shell" structure such as Al/$Al_3O_2$ or Ti/$TiO_2$. For the NWL process to result in the desired TWT nanostructure, the chosen material for the shell must withstand the etching process for the underlying substrate film. Regarding the SOI structure as the most common substance of the underlying film, most oxides are suitable as the protective shell for the DRIE process.

Figures 5A, 5B:
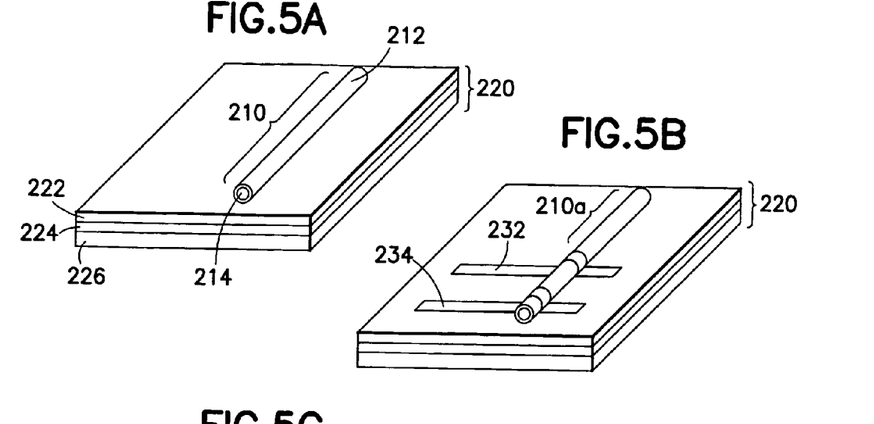
FIGS. 5A-5E illustrate a process flow for fabricating a self-aligned twin nanowire transistor (TWT) device structure according to an embodiment of the invention.

First, as shown in FIG. 5A, a metallic core/insulating shell nanowire 210 is disposed on an SOI substrate 220 which comprises at least a silicon upper layer 222, a $SiO_2$ lower layer 224 and maybe other layers 226. This step is the same as in FIG. 4A, except that the nanowire 210 comprises a shell 212 and a core 214 made with different materials.

Next, the nanowire 210 is contacted by two separate metal contacts 232 and 234, so that the nanowire 210 bridges a gap between the metal contacts 232 and 234. The resulting metal contacts and the nanowire combination forms a mask on the substrate 220. Again, it is noted that the metal contacts 232 and 234 can be deposited before or after disposing the nanowire 210, as far as the quality of the contacts is concerned. It is also noted that, as shown in FIG. 5B, the mask is arranged such that one section of the nanowire 210 extends beyond one of the metal contacts (e.g. metal contact 232) in a length that is at least sufficient for a third metal contact later (hereinafter an extended section 210a). The first two metal contacts 232 and 234 will play the function of a source terminal and a drain terminal, respectively, of the TWT transistor.

Figures 5C, 5D:
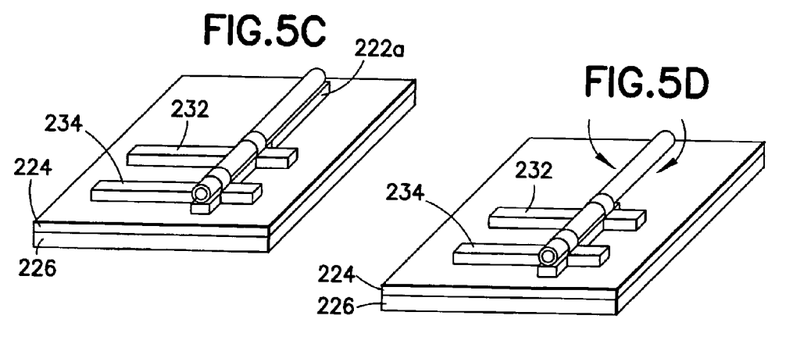

Next, as shown in FIG. 5C, via the NWL process as described before, a conformal device structure is created by removing the unmasked areas of the upper Si layer 222 of the SOI substrate 220. Part of the conformal nanowire created 222a (i.e. the Si active layer that is left underneath the nanowire mask) will later play the role of the transistor channel.

Next, as shown in FIG. 5D, a part of the conformal Si nanowire 222a that is below the nanowire mask 210 and between the two metal contacts 232 and 234 is kept intact while the section of the conformal Si nanowire that is underneath the extended section 210a of the nanowire mask 210 is locally removed by a second etching (as indicated by the arrows). Compared to the first DRIE etching which is highly anisotropic, the second etching is a more isotropic process.

Figure 5E:
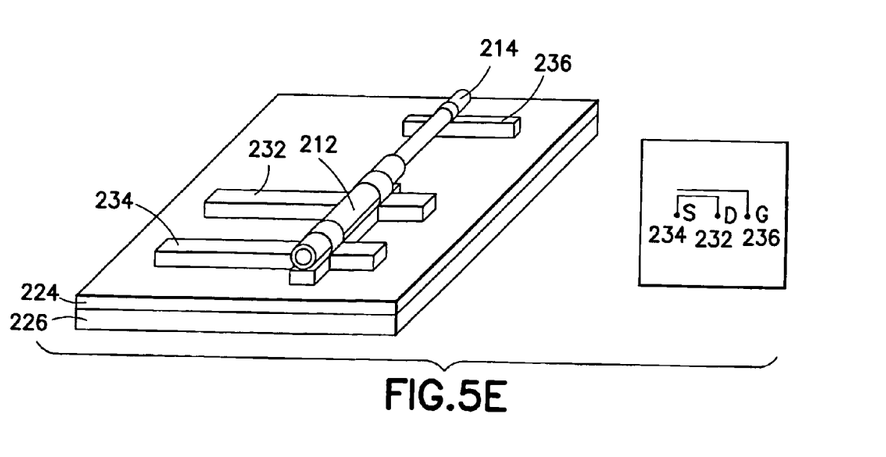

Next, as shown in FIG. 5E, the protective oxide shell 212 of the nanowire mask 210 at the extended section 210a is locally stripped by yet another etching process, so that the conductive core 214 of the nanowire mask 210 is locally exposed. At this point, a third metal contact 236 is fabricated a certain distance from the channel region between metal contacts 232 and 234. The third metal contact 236 acts as a gate terminal and it is in direct contact with the exposed core 214 of the nanowire mask 210.

This TWT structure can now be operated as a three-terminal device, as schematically illustrated in the drawing on the right side of FIG. 5E. It is important to note that, even if the source and drain contacts are partially deposited on top of the nanowire mask, the oxide shell of the nanowire mask prevents shorting of the conductive core with the contacts and therefore prevents gate leakage.

In the above-described TWT process, the FET structure and the gate interconnect are achieved in a single process. This solves the prior problems of having to align the top gate over the nanowire channel in a separate step as shown in FIG. 2. Therefore, the present approach results in a simpler and less expensive fabrication process of the bottom-up nanoscale building blocks.

Furthermore, the above-described TWT concept can be extended to a self-aligned TWT structure that employs a semiconducting core/insulating shell nanowire mask. The process flow as shown in FIGS. 5A-5E is also applicable to a core/shell nanowire mask where the core of the nanowire is made of a semiconductive material instead of a conductive material. The simplest and most compatible system for such a nanowire mask is a nanowire made of a Si/SiO$_2$ core/shell combination. This kind of nanowire is relatively simple to prepare using methods known in the art or being developed.

Figure 6:
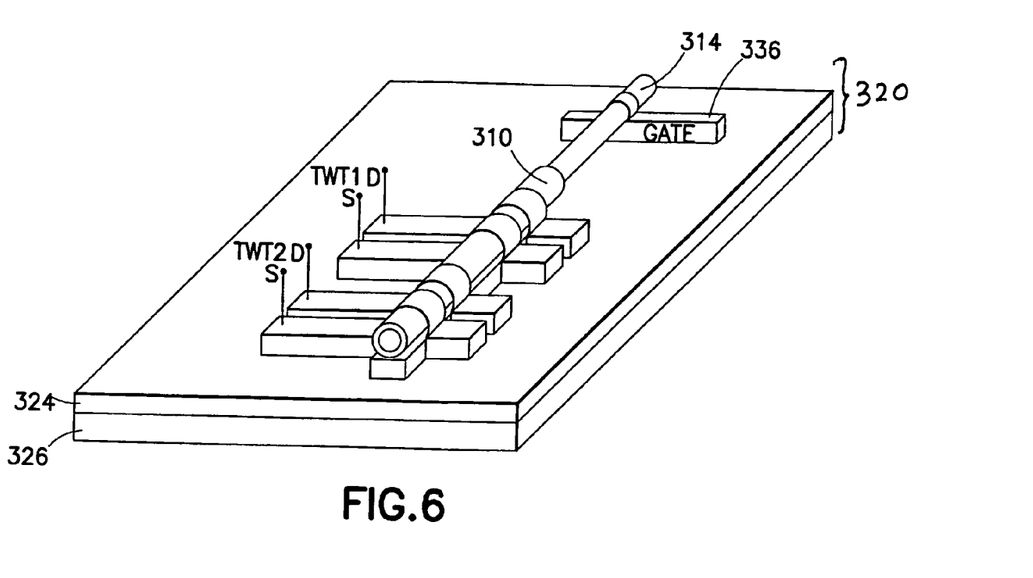
FIG. 6 is an exemplary arrangement of a multiple TWT nanodevice structure that includes TWTs built in cascade via a single nanowire mask according to an embodiment of the invention.

Considering that a chemically synthesized nanowire mask can be up to several microns in length and modern lithography techniques routinely allows the fabrication of transistors with sub-100 nm source-drain gaps, it comes straightforwardly that a row of many TWTs can be produced in cascade from a single nanowire mask (i.e. many TWTs share a single gate terminal). As illustrated in FIG. 6, in a similar NWL process as the one shown in FIGS. 5A-5E, two or more pairs of source-drain terminals (TWT1, TWT2, . . . ) are fabricated simultaneously on a single nanowire mask 310. Areas of the top silicon layer of the SOI substrate 320 that are not covered by the mask are etched away, leaving a single-crystalline silicon nanowire structure on the SiO$_2$ insulator layer 324. The protective oxide shell of the nanowire mask 310 at the extended section is locally stripped, so that the conductive or semiconductive core 314 of the nanowire mask 310 is locally exposed. All the source-drain pairs share a common gate terminal 336 which is in contact with exposed nanowire core 314.

It is to be understood that the above-described arrangements are only illustrative of the applications of the principles of the teachings hereof. In particular, it should be understood that although only a few examples have been shown, the teachings hereof are not restricted to those examples. Numerous modifications and alternative arrangements may be devised by those skilled in the art without departing from the scope of the present disclosure.

The invention claimed is:

1. A method, comprising:
disposing a mask on a semiconductor upper layer of a multi-layer substrate, the semiconductor upper layer being adjacent to an insulator lower layer, and
removing areas of the upper layer not covered by the mask in a first lithography,
wherein the mask comprises a first and a second conductive pads separated by a distance, and a nanowire in contact with the first and the second conductive pads across the distance, wherein the nanowire comprises a shell made of an insulating material and a core made of a conductive or a semiconductive material, said nanowire being in contact with the first and the second conductive pads across the distance and extending beyond one of the conductive pads as an extended section, and wherein the method further comprises:
removing an area of the upper layer covered by the extended section of the nanowire in a second lithography,
removing a part of the shell at the extended section to expose the conductive or semiconductive core, and
disposing a third conductive pad in contact with the exposed core,
wherein the first and the second conductive pads form a source terminal and a drain terminal, respectively, and the third conductive pad forms a gate terminal, of a field effect transistor.

2. The method of claim 1, wherein the first lithography is carried out using a deep-reactive-ion-etching, which results in an integration of the mask and the underlying semiconductor upper layer.

3. The method of claim 1, wherein the nanowire has a length of 0.1 to 50 microns and a diameter of 10 to 50 nanometers.

4. The method of claim 1, wherein the upper layer comprises silicon, the lower layer comprises silicon dioxide, and the nanowire comprises silicon dioxide.

5. The method of claim 4, wherein the upper layer is doped with a positive carrier element or a negative carrier element.

6. The method of claim 1, further comprises:
disposing an insulating layer covering the nanowire and the silicon layer, and
disposing a third conductive pad on the insulating layer,
wherein the first and the second conductive pads form a source terminal and a drain terminal, respectively, and the third conductive pad forms a gate terminal, of a field effect transistor.

7. The method of claim 1, wherein the shell of the nanowire is at least 5 nanometers in thickness.

8. The method of claim 1, wherein the core of the nanowire is Al, Si or Ti and the shell of the nanowire is an oxide of Al, Si or Ti, respectively.

9. The method of claim 1, wherein the core of the nanowire is Si and the shell of the nanowire is silicon dioxide.

10. The method of claim 1, wherein the core of the nanowire is a carbon nanotube and the shell of the nanowire is silicon dioxide.

11. The method of claim 1, wherein the first and the second conductive pads form a first pair of terminals, the mask further comprises one or more pairs of terminals, and the nanowire is in contact with the one or more pairs of terminals and extends beyond all the terminals as the extended section, and wherein each pair of terminals and the third conductive pad form a field effect transistor.

12. A device, comprising;
a first and a second conductive terminals separated by a distance, and
a channel connecting the first and the second terminals across the distance,
wherein the device is constructed by:
disposing a mask comprising the first and the second conductive terminals and a nanowire across the distance in touch with the conductive terminals on a semiconductor upper layer of a multi-layer substrate, the semiconductor upper layer being adjacent to an insulator lower layer, and
removing areas of the upper layer not covered by the mask in a first lithography to form the channel, wherein the nanowire comprises a shell made of an insulating material and a core made of a conductive or a semiconductive material, the nanowire is in contact with the first and the second conductive terminals across the distance and extends beyond one of the conductive terminals as an extended section, and wherein the device further comprises a third conductive terminal, the first and the second conductive terminals form a source terminal and a drain terminal, respectively, and the third conductive terminal forms a gate terminal, of a field effect transistor, and wherein the third terminal is constructed by:

removing an area of the upper layer covered by the extended section of the nanowire in a second lithography, removing a part of the shell at the extended section to expose the conductive or semiconductive core, and disposing the third conductive terminal in contact with the exposed core.

13. The device of claim 12, wherein the first lithography is carried out using a deep-reactive-ion-etching, which results in an integration of the mask and the underlying semiconductor upper layer.

14. The device of claim 12, wherein the nanowire has a length of 0.1 to 50 microns and a diameter of 10 to 50 nanometers.

15. The device of claim 12, wherein the upper layer comprises silicon, the lower layer comprises silicon dioxide, and the nanowire comprises silicon dioxide.

16. The method of device 15, wherein the upper layer is doped with a positive carrier element or a negative carrier element.

17. The device of claim 12, further comprises:
    an insulating layer covering the nanowire and the silicon layer, and
    a third conductive terminal disposed on the insulating layer,
wherein the device is a field effect transistor and the first and the second conductive terminal are a source terminal and a drain terminal, respectively, and the third conductive terminal is a gate terminal.

18. The device of claim 12, wherein the shell of the nanowire is at least 5 nanometers in thickness.

19. The device of claim 12, wherein the core of the nanowire is Al, Si or Ti and the shell of the nanowire is an oxide of Al, Si or Ti, respectively.

20. The device of claim 12, wherein the core of the nanowire is Si and the shell of the nanowire is silicon dioxide.

21. The device of claim 12, wherein the core of the nanowire is a carbon nanotube and the shell of the nanowire is silicon dioxide.

22. The device of claim 12, wherein the first and the second conductive terminals form a first pair of terminals, the mask further comprises one or more pairs of terminals, and the nanowire is in contact with the one or more pairs of terminals and extends beyond all the terminals as the extended section, and wherein each pair of terminals and the third conductive terminal form a field effect transistor.

* * * * *

UNITED STATES PATENT AND TRADEMARK OFFICE
CERTIFICATE OF CORRECTION

| | |
|---|---|
| PATENT NO. | : 8,022,393 B2 |
| APPLICATION NO. | : 12/221068 |
| DATED | : September 20, 2011 |
| INVENTOR(S) | : Alan Colli |

It is certified that error appears in the above-identified patent and that said Letters Patent is hereby corrected as shown below:

At column 10, line 1, (claim 16, line 1), "method of device 15" should be --device of claim 15--.

Signed and Sealed this
Twentieth Day of March, 2012

David J. Kappos
*Director of the United States Patent and Trademark Office*